(12) United States Patent
Ke et al.

(10) Patent No.: US 12,388,457 B2
(45) Date of Patent: Aug. 12, 2025

(54) METHOD AND APPARATUS FOR LOW-COMPLEXITY SYMBOL-RATE RECEIVER DIGITAL SIGNAL PROCESSING

(71) Applicant: Huawei Technologies Co., Ltd., Shenzhen (CN)

(72) Inventors: Jianhong Ke, Ottawa (CA); Zilong He, Beijing (CN); Chuandong Li, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 157 days.

(21) Appl. No.: 18/140,145

(22) Filed: Apr. 27, 2023

(65) Prior Publication Data
US 2023/0318613 A1    Oct. 5, 2023

Related U.S. Application Data

(63) Continuation of application No. PCT/CN2020/125638, filed on Oct. 31, 2020.

(51) Int. Cl.
*H03M 1/12*    (2006.01)
*H03M 1/60*    (2006.01)

(52) U.S. Cl.
CPC ........... *H03M 1/1255* (2013.01); *H03M 1/60* (2013.01)

(58) Field of Classification Search
CPC ....... H03M 1/1255; H03M 1/124; H03M 1/26
USPC ........................................................ 341/155
See application file for complete search history.

(56) References Cited

U.S. PATENT DOCUMENTS

| | | | |
|---|---|---|---|
| 10,038,498 B1 | 7/2018 | Fan et al. | |
| 12,040,554 B2 * | 7/2024 | Ota | H01Q 21/061 |
| 2003/0081669 A1 * | 5/2003 | Yousef | H04L 25/03057 |
| | | | 375/233 |
| 2007/0053462 A1 * | 3/2007 | Pirooz | H04L 27/2675 |
| | | | 375/285 |
| 2010/0209121 A1 | 8/2010 | Tanimura | |
| 2015/0365174 A1 * | 12/2015 | Nazarathy | H04J 14/002 |
| | | | 398/208 |

FOREIGN PATENT DOCUMENTS

| | | |
|---|---|---|
| CN | 102511135 A | 6/2012 |
| CN | 107949992 A | 4/2018 |
| CN | 108702221 A | 10/2018 |
| EP | 2502364 A4 | 9/2012 |
| EP | 2672636 B1 | 7/2019 |

OTHER PUBLICATIONS

Shynk, J.J. "Frequency-domain and multirate adaptive filtering" IEEE Signal Processing Magazine, 9. 1992.
Han Sun, Kuang-Tsan Wu "Timing Synchronization in Coherent Optical Transmission Systems" Enabling Technologies for High Spectral-Efficiency Coherent Optical Communication Networks, Chapter 10. https://doi.org/10.1002/9781119078289.ch10 2016.
Gabriel Charlet "Coherent detection associated with digital signal processing for fiber optics communication" Comptes Rendus Physique vol. 9, Issues Nov. 9-10, 2008.

* cited by examiner

*Primary Examiner* — Peguy Jean Pierre (57) ABSTRACT

A digital signal processor (DSP) for a receiver and a method for processing signals in a receiver are provided. The DSP comprises a processor configured to: receive a digital signal at a symbol rate in a frequency domain; and compensate an impairment of the digital signal in the frequency domain.

20 Claims, 4 Drawing Sheets

METHOD AND APPARATUS FOR LOW-COMPLEXITY SYMBOL-RATE RECEIVER DIGITAL SIGNAL PROCESSING

RELATED APPLICATIONS

This application is a continuation of International Patent Application No. PCT/CN2020/125638, filed Oct. 31, 2020, the contents of which are incorporated herein by reference.

FIELD

The present invention generally relates to digital signal processing, and in particular, to a method and apparatus for low-complexity symbol-rate receiver digital signal processing.

BACKGROUND

Coherent detection together with digital signal processing (DSP) is capable of compensating various linear and non-linear impairments. For short-reach applications, the complexity and power consumption of DSP are major concerns. Therefore, reducing the complexity and power consumption for short-reach DSP applications is desirable.

SUMMARY

The present disclosure provides a low-power and efficient low-complexity symbol-rate DSP scheme with a frequency domain equalizer structure for short-reach applications.

The present disclosure reduces the ADC sample rate to symbol rate at the receiver so that the receiver (Rx) DSP operates at symbol rate (T/1). As such, the power consumption of both ADC and Rx DSP are greatly reduced. The present disclosure also provides an efficient T/1 timing recovery approach.

According to an aspect, there is provided a digital signal processor (DSP) for a receiver, which comprises a processor configured to: receive a digital signal at a symbol rate in a frequency domain; and compensate an impairment of the digital signal in the frequency domain.

According to an aspect, there is provided a method for processing signals in a receiver, comprising: receiving a digital signal at a symbol rate in frequency domain; and compensating an impairment of the digital signal in frequency domain.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Unless otherwise defined or unless context indicates otherwise, all technical and scientific terms used herein have the same meaning as commonly understood by one of ordinary skill in the art to which the described embodiments appertain.

Figure 1:
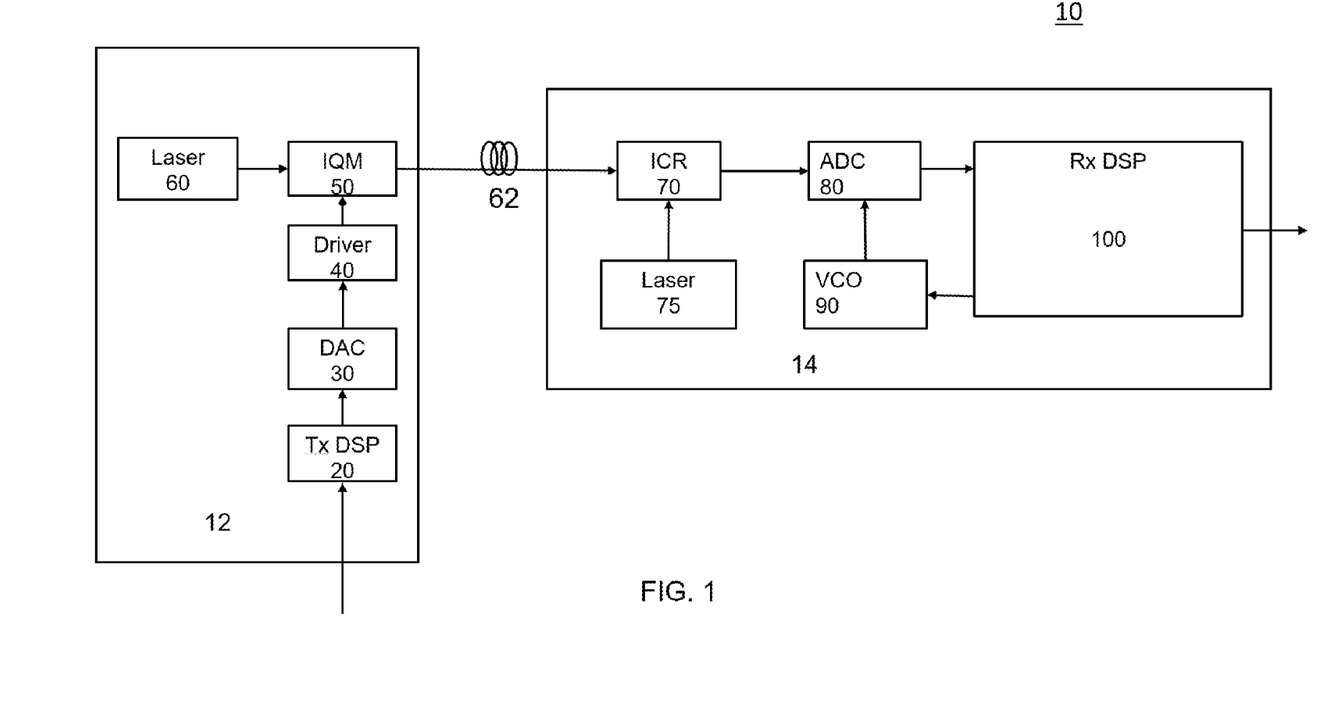
FIG. 1 is a block diagram of a telecommunication system with a transmitter and a receiver (Rx) having a digital signal processor (DSP), according to the present disclosure.

FIG. 1 is a block diagram of an optical communication system 10. In the example of FIG. 1, the system 10 comprises a transmitter 12, a receiver 14, and a fiber link 62 interconnecting the transmitter 12 and receiver 14. The transmitter 12 comprises a transmitter (Tx) digital signal processor (DSP) 20, a Tx digital to analog convertor (DAC) 30, a driver 40, an in-phase quadrature modulator (IQM) 50, and a Tx laser 60. The receiver 14 includes an integrated coherent receiver (ICR) 70, a receiver (Rx) laser 75, an Rx analog to digital convertor (ADC) 80, a voltage-controlled oscillator 90, and an Rx DSP 100.

In the transmitter 12, the Tx DSP 20 is configured to receive digital signals and process, such as pre-compensate, the received digital signals. A received digital signal is a two-dimensional vector having an X-polarization and a Y-polarization. The Tx DAC 30 is configured to convert the processed digital signals to analog signals. The analog signals are amplified by the driver 40. The amplified analog signals are then modulated at IQM 50 by the Tx laser 60. The IQM 50 converts the amplified analog signals into optical signals having X-polarization and Y-polarization.

The X- and Y-polarized optical signals are transmitted through fiber link 62. In some examples, the analog signals may also be modulated to RF signals and the analog RF signals may be transmitted wirelessly by one or more antennas.

In the receiver 14, the X- and Y-polarized optical signals are detected at ICR 70. A local oscillator that includes Rx laser 75 provides an optical demodulating signal to enable the ICR 70 to convert or demodulate the optical signals to X- and Y-polarized analog signals.

The Rx ADC 80 is configured to convert the X- and Y-polarized analog signals to X- and Y-polarized digital signals. The X- and Y-polarized digital signals are then forwarded the Rx DSP 100 for processing.

In system 10, due to the differences in hardware in the transmitter 12 and the receiver 14, and physical characteristics of the transmission medium (e.g. fiber link 62), the digital signals received at the Rx DSP 100 may suffer various impairments, including linear and non-linear channel impairment, frequency shift, time delay and timing misalignment, channel impairment, etc. Some impairments are non-time-varying impairments such as chromatic dispersion (CD), S21, match filtering, while some impairments are time-varying impairments such as polarization mode dispersion (PMD), polarization division de-multiplexing, etc. Adaptive equalization can be used to compensate time-varying impairments and residual non-time-varying impairments, such as residual CD.

In the present application, by processing the received digital signals, the Rx DSP 100 is configured to compensate various impairments suffered by the received digital signals. The Rx DSP 100 may compensate impairments of the digital signals by adjusting the received digital signals to reduce time delays, phase shifts, frequency offsets, timing errors, and other applicable parameters of the digital signals to an acceptable extent. In some examples, as will be described in greater detail below, the Rx DSP 100 may adjust the digital signals by equalizing the digital signals, such as by correlating the digital signals in frequency domain with the MIMO taps, updating MIMO taps and the digital signals, until the time domain error of the received digital signals is within an acceptable range.

However, time-domain equalization can contribute significantly to overall DSP complexity, especially when used to support a large number of taps. Frequency-domain equalization (FDEQ) structures may be used to reduce complexity by taking advantage of a block-by-block signal processing strategy in frequency domain and efficient implementation of a discrete Fourier transform (DFT) function.

In the present disclosure, in receiver 14, when the Rx ADC 80 converts the X- and Y-polarized analog signals to digital signals, the Rx ADC 80 is configured to sample the X- and Y-polarized analog signals from the ICR 70 at a sample rate equal to the symbol rate (T/1) of the digital signals received at the Tx DSP 20. As such, the digital signals output from the Rx ADC 80 are at the original symbol rate (T/1). The Rx ADC 80 forwards the X- and Y-polarized digital signals at the symbol rate to the Rx DSP 100 for processing, including impairment compensation, as will be described in greater detail below. The Rx DSP 100 is also configured to adjust the VCO 90, which in turn controls the frequency and phase of sampling clock signals used in the Rx ADC 80.

The optical communication system 10 may be a short reach application. For example, the distance between the transmitter 12 and receiver 14, or the length of the fiber link 62, is less or equal to 40 kilometers. In the short reach application, the channel impairments are not as severe as those in long haul system. Thus, in at least some applications, over sampling is not essential for impairment compensation.

The overall complexity of the Rx ADC 80 and Rx DSP 100 is proportional to sample rate. Thus, reducing sampling rate can enable a low power design. By reducing sample rate of the Rx ADC 80 to one sample per symbol (T/1) (e.g., sample rate=symbol rate), the complexity and power consumption Rx ADC 80 and Rx DSP 100 may be greatly reduced. As well, operating Rx ADC 80 at a sample rate that equals the symbol rate can consume less power.

Figure 2:
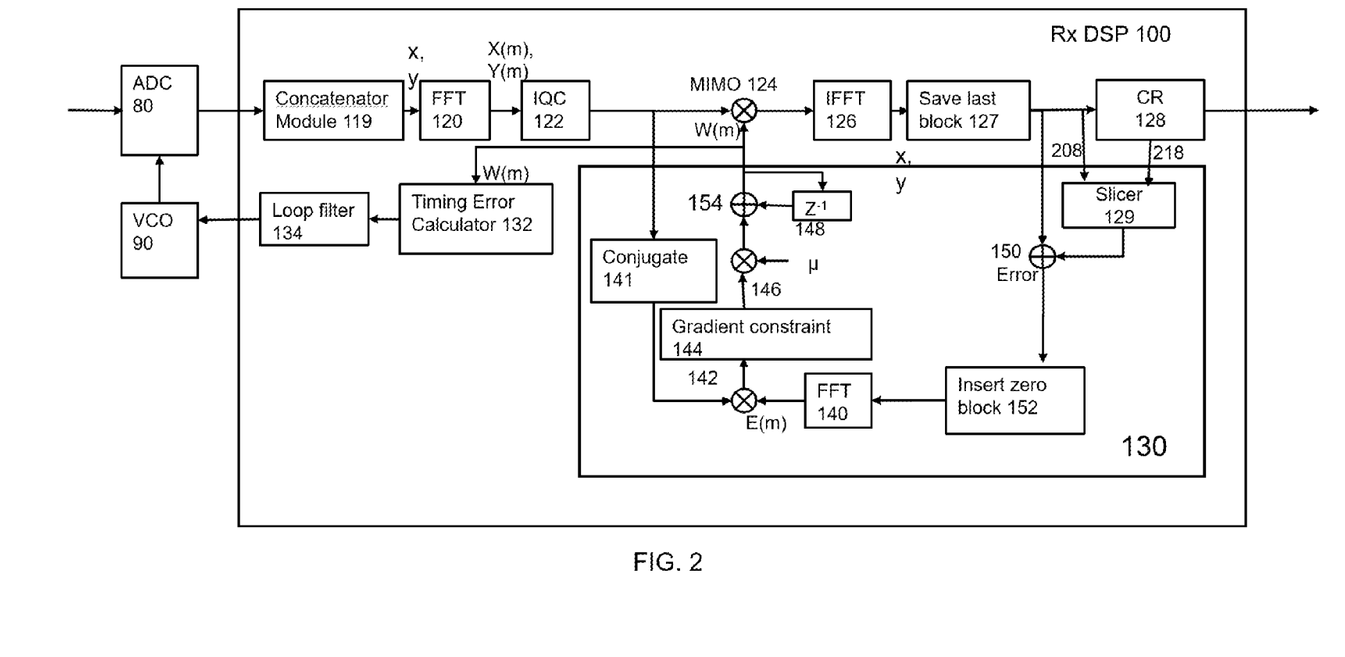
FIG. 2 is a block diagram of an example logical structure of the Rx DSP in FIG. 1.

As illustrated in the example of FIG. 2, the Rx DSP 100 includes a concatenator module 119, a Fast Fourier Transformation (FFT) module 120, a IQC unit 122, a 2×2 multiple input multiple output (MIMO) module 124, an Inverse Fast Fourier Transform (IFFT) module 126, a save last block module 127, a Carrier Recovery (CR) module 128, a MIMO taps update module 130, a timing error calculator 132, and a loop filter 134.

As used here, a "module" can refer to a combination of a hardware processing circuit and machine-readable instructions (software and/or firmware) executable on the hardware processing circuit. A hardware processing circuit can include any or some combination of a microprocessor, a core of a multi-core microprocessor, a microcontroller, a programmable integrated circuit, a programmable gate array, a digital signal processor, or another hardware processing circuit.

As illustrated in FIG. 2, the Rx DSP 100 comprises a concatenator module 119 configured to concatenate X- and Y-polarized time-domain digital signals from the ADC 80 at a symbol rate. The $m^{th}$ block of data in signal x and y in time domain contains the most recent N data samples from the previous N data samples in time domain for both X polarization and Y polarization, respectively. For example, the concatenator module 119 concatenates the $m^{th}$ block of most recent X-polarized N data samples in the digital signals with previous block of X-polarized N data samples in the digital signals. Similarly, the block concatenator 119 concatenates the $m^{th}$ block of most recent Y-polarized N data samples with previous block of Y-polarized N data samples in digital signals. Hence, the overall length of the $m^{th}$ block of the X- and Y-polarized digital signals output from the concatenator module 119 is 2N.

The FFT module 120 is configured to convert the input time domain digital signals from the concatenator module 119 to frequency domain signals. The FFT module 120 performs 2N point FFT and transforms the X- and Y-polarized digital signals in time-domain to X- and Y-polarized digital signals in frequency domain. The X- and Y-polarized digital signals in time domain are represented by x and y, and their corresponding X- and Y-polarized digital signals frequency domain may be represented by X and Y respectively. The output signals from FFT module 120 are as follows:

$$X=FFT(x)$$

$$Y=FFT(y).$$

As illustrated in the example of FIG. 2, the Rx DSP 100 includes an IQC unit 122 to compensate signals X and Y output from FFT module 120. The IQC unit 122 is configured to compensate the In-phase Quadrature (IQ) skew and quadrature error of the signals in frequency domain. The Rx DSP 100 may first compensate In-phase Quadrature (IQ) skew and quadrature error in frequency domain X- and Y-polarized digital signals at IQC unit 122. In-phase Quadrature Compensation (IQC) includes IQ skew compensation and quadrature error compensation. Due to imperfection of ICR 70, in-phase and quadrature signals X and Y may have a delay or skew $\Delta\tau$ and quadrature errors $\Delta$Err. The impairments caused by IQ skew and quadrature error are compensated in frequency domain by IQC unit 122 at the front-end of the Rx DSP 100 before compensation of other impairments. Unlike typical DSPs in which IQC is performed in the time domain, in Rx DSP 100, the IQC unit 122 is in frequency-domain and performs IQC in frequency domain for further power reduction.

Each of signals X and Y is a complex signal, which includes, in frequency domain, a first element I, and a second element Q. For example, signal X can be denoted as X=XI+jXQ, where $$XI(k) = \frac{X(k) + X*(N-k)}{2}$$

$$jXQ(k) = \frac{X(k) - X*(N-k)}{2},$$

where N is the number of data samples, and K is an integer.

In some examples, in IQ skew compensation, the IQC unit 122 compensates XQ according to the function (where skew is represented as $\Delta\tau$):

$$XQ=XQ\cdot e^{j2\pi f_k \Delta\tau}.$$

In quadrature compensation, the IQC unit 122 compensates XQ according to the function (where quadrature error is represented as $\Delta$Err):

$$XQ = XQ + XI \cdot \sin\left(\frac{\Delta Err}{\pi}\right).$$

The IQC unit 122 also compensates signal YQ and YI in frequency domain in the same manner as signal X as descried above. By compensating the signals X and Y at IQC unit 122, the skew Δτ and quadrature errors ΔErr are eliminated from the signals X and Y output from IQC unit 122 to MIMO module 124. The IQ compensated signals X and Y are input to the MIMO module 124 and the MIMO taps update module 130.

The 2×2 MIMO module 124 is configured to compensate for signal impairments in frequency domain, based on MIMO tap value inputs from the MIMO taps update module 130, as will be described in greater detail in FIG. 3.

As illustrated in FIG. 2, the output signals X and Y from the 2×2 MIMO module 124 are provided to IFFT module 126. The IFFT module 126 is configured to convert the signals in frequency domain to signals in time domain. In order to update values of the MIMO taps update module 130, the output signals X and Y from the 2×2 MIMO module 124 in the frequency domain are converted to time domain signals. The IFFT module 126 is configured to perform 2N point IFFT to convert frequency domain digital signals X and Y to corresponding digital signals x and y in time domain.

In the example of FIG. 2, the time domain digital signals x and y output from the IFFT module 126 are provided to the save last block module 127. The save last block module 127 removes first N samples from time domain digital signals x and y.

In the example of FIG. 2, after the save last block module 127 removes first N samples from time domain digital signals x and y, in an embodiment, the time domain digital signals x and y are input to the CR module 128.

The CR module 128 is configured to further compensate frequency offset and phase shift of the signals in time domain. The carrier frequency offset and phase shift compensated signals x and y are then provided to the MIMO taps update module 130.

In another embodiments, the time domain digital signals x and y output from the save last block module 127 are input to the MIMO taps update module 130.

The MIMO taps update module 130 is configured to update the MIMO tap values based on a time domain error signal associated with the signals output from the IFFT module 126. In the example of FIG. 2, the MIMO taps update module 130 comprises a slicer 129, a first adder 150, an insert zero block module 152, a second FFT module 140, a second multiplier 142, a conjugate module 141, gradient constraint unit 144, a third multiplier 146, a delay element 148, and a second adder 154.

The slicer 129 is configured to generate, based on the carrier frequency offset and phase shift compensated signals x and y output from the save last block module 127, a desired response.

The first adder 150 subtracts the output of the save last block module 150 from the desired response from the slicer 129 to generate a time domain error signal. The length of the time domain error signal is N.

The time domain error signal is provided to insert zero block module 152. The insert zero block module 152 is configured to add a block of N zeros to the time domain error signal in order to make the length of the error signal to 2N. The second FFT module 140 performs 2N point FFT to convert the time domain error signal into frequency domain error signals E(m), which includes $E_x(m)$ and $E_y(m)$ in X-polarization and Y-polarization respectively. The X- and Y-polarized frequency domain error signals $E_x(m)$ and $E_y(m)$ are provided to the second multiplier 142.

The conjugate module 141 conjugates the frequency domain signals X, Y output from the IQC module 122, which are IQ compensated as described above. The conjugate module 141 provides conjugated signals [X,Y] to the second multiplier 142. The second multiplier 142 multiplies the conjugated signals [X,Y] with X- and Y-polarized frequency domain error signals $E_x(m)$ and $E_y(m)$, and provides the resultant to the gradient constraint unit 144.

The gradient constraint unit 144 is configured to generate a gradient constraint G{·} from the output of the multiplier 142. Typically, the gradient constraint unit 144 performs IFFT on the received signals having a length of 2N, deletes last N samples of the time domain received signal, and adds a block of N zeroes and performs 2N point FFT to the gradient constraint G{·}. The gradient constraint G{·} is multiplied with μ by the third multiplier 146 to generate updated MIMO taps update module 130.

In FIG. 2, In order to provide the 2×2 MIMO module 124 with current MIMO tap values W(m), the second adder 154 and the delay element 148 of the MIMO taps update module 130 provide a delay. The MIMO taps update module 130 forwards the current MIMO tap values W(m) to the MIMO module 124 and the timing error calculator 132 for compensating impairments of digital signals.

The timing error calculator 132 is configured to determine a timing error in Baud $\tau_{Baud}$ of the signals based on the input W(m) generated from the MIMO taps update module 130.

Using $\tau_{Baud}$, the loop filter 134 is configured to tune the VCO 90. The VCO 90 is configured to adjust the sampling clock frequency of Rx ADC 80.

Figure 3:
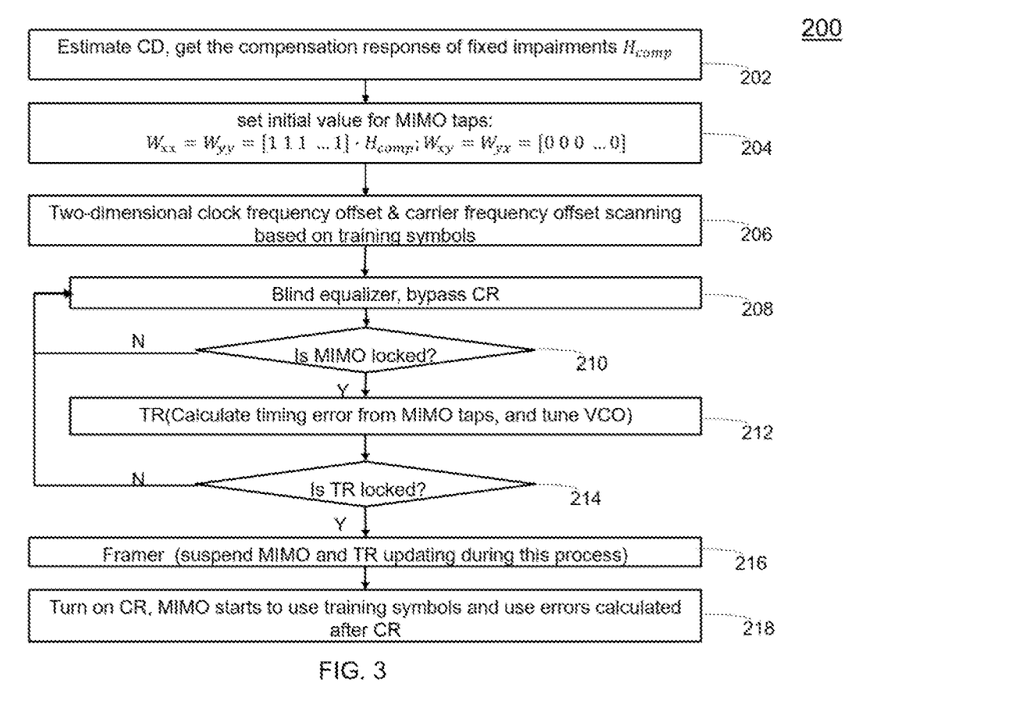
FIG. 3 is a flowchart illustrating an example process of digital signal processing using the Rx DSP in FIG. 1.

FIG. 3 is a flowchart showing an operational process 200 of the Rx DSP 100 for compensating further impairments of signals X and Y. After IQC unit 122 compensates signals X and Y for impairments of IQ skew and quadrature error, the signals X and Y may be provided to MIMO module 124 for further compensating of impairments.

At step 202, the MIMO module 124 estimates a chromatic dispersion (CD) and generates a compensation response of fixed impairments $H_{comp}$ in the frequency domain to compensate fixed impairments. $H_{comp}$ is a vector. The compensation response of the fixed impairments $H_{comp}$ may be obtained by CD estimation (CDE) and S21 calibration.

At step 204, the MIMO module 124 sets the initial value for MIMO taps update module 130 for the 2×2 MIMO module 124 as $$W_{xx}=W_{yy}=[1 \quad 1 \quad 1 \quad . \quad . \quad . \quad 1]\cdot H_{comp};\ W_{xy}=W_{yx}=[0\ 0\ 0\ \ldots\ 0].$$

The initial value of the MIMO taps update module 130 is saved for use in a blind equalization at step 208 to be described below.

At step 206, the MIMO module 124 is configured to perform a two-dimensional clock frequency offset and carrier frequency offset scanning. The scanning uses the training symbols inserted in the signals at the transmitter 12. At the Tx DSP 20 in time domain, a plurality of training symbols, such as 16 training symbols, are inserted in the digital signals. The plurality of training symbols form a training sequence (TrainSeq). The training symbols are therefore also included in the digital signals received by the Rx DSP 100. The Rx DSP 100 at the receiver 14 is pre-configured with the same training symbol information as the transmitter 12, such as clock frequency of the training symbols, and the number of the training symbols.

The two-dimensional clock frequency offset and carrier frequency offset scanning estimates the clock frequency offset between Tx DAC 30 and Rx ADC 80, and the carrier frequency offset between Tx Laser 60 and Rx Laser 75.

Due to the separate and independent sampling clocks of the Tx DAC 30 and the Rx ADC 80, there can be a sampling clock difference between the sampling clocks. After the signal is processed at the Rx ADC 80, the signal may include a variable sampling delay t at the time domain, and may be denoted as below:

$$\text{signal}(t-\tau),$$

where signal (t) denotes both x(t) and y(t) in X- and Y-polarizations in time domain.

The delay t causes a sampling phase offset, and the sampling phase offset can be time varying due to clock frequency offset and random phase jitter. The sampling phase offset is equivalent to a phase shift $e^{j2\pi ft}$ of the signal in frequency domain:

$$\mathit{fft}(\text{signal}(t))\cdot e^{j2\pi ft}$$

where fft(signal(t)) denotes both signals X and Y in frequency domain.

Blind equalizers, such as Constant Modulus Algorithm (CMA) and Least Mean Squares (LMS), can compensate the clock frequency offset to a limited extent. However, blind LMS can only lock within a limited clock frequency offset range, for example smaller than 20 ppm. If the signal has a clock frequency offset greater than 20 ppm, clock frequency offset scanning is used to roughly estimate the clock frequency offset and to ensure the convergence of blind LMS.

Clock frequency offset scanning estimates the clock frequency offset between the clock of Tx DAC 30 and Rx ADC 80. The MIMO module 124 is configured to scan the clock frequency offset $\Delta f_{clk}$ by adjusting the control signal of VCO 90. In some examples, the MIMO module 124 correlates the digital signal with the training sequence (TrainSeq) to perform the clock frequency offset scanning. Based on the correlation between the training sequence and the digital signal under different scan values of $\Delta f_{clk}$, the estimated clock frequency offset corresponds to the scan value at the maximum correlation peak value. Under each scanning value of $\Delta f_{clk}$, the maximum correlation peak value can be determined by multiplying the digital signal at symbol rate in frequency domain with the conjugate of training sequence (TrainSeq) in frequency domain as denoted below:

$$\text{correlation peak}=\max[\mathit{ifft}(\text{conj}(\mathit{fft}(\text{TrainSeq}))\cdot\mathit{fft}(\text{signal}(t)))]$$

which corresponds to correlation of the training sequence and signal in time domain:

$$\text{correlation peak}=\max[\text{TrainSeq}^*(\text{signal}(t))]$$

where (*) denotes correlation in time domain, which corresponds to vector conjugate multiplication (conj( )·) in frequency domain.

The maximum correlation peak value of the digital signal at a symbol rate with the training sequence (TrainSeq) corresponds to the minimum residual clock frequency offset with the VCO adjusting. After the scan value of clock frequency offset at the maximum correlation peak value is identified, the VCO 90 is configured to compensate Rx clock frequency offset with the estimated frequency offset value $\Delta f_{clk\text{-}est}$. If the clock frequency offset is too big, the blind LMS cannot converge. As the carrier frequency offset also affects the maximum correlation value, another scanning dimension for carrier frequency offset estimation is also used in a two-dimensional clock frequency offset and carrier frequency offset scanning to ensure a reliable clock frequency offset scanning.

As described above, due to the separation and independence of Tx laser 60 and Rx laser 75, there can be a central frequency difference $\Delta f$, also known as carrier frequency offset, between Tx laser 60 and Rx laser 75. The value of $\Delta f$ can be several GHz.

The carrier frequency offset scanning is based on the correlation between the training sequence and the digital signal with the frequency difference $\Delta f$. In time-domain compensation schemes, a time-domain numeral controlled oscillator (NCO) is used to compensate carrier frequency offset $\Delta f$ to the digital signal. The estimated carrier frequency offset $\Delta f_{est}$ corresponds to the scan value of frequency difference at the maximum correlation value.

However, the frequency domain compensation performed by Rx DSP 100 at IQC unit 122 does not include a time-domain NCO. As frequency point spacing=sample rate/FFT size, frequency shift can be used to adjust frequency offset in low capacity cases. However, the resolution of the frequency shift in high capacity cases is too low to have a good frequency offset shift.

In Rx DSP 100, the MIMO module 124 is configured to perform a carrier frequency offset scanning in frequency domain. The carrier frequency offset scanning in time domain corresponds to the equations (a) and (b) below:

$$(\text{TrainSeq}\cdot e^{j2\pi\Delta ft})^*\text{signal}(t) \qquad\qquad (a)$$

which is equivalent to $$\text{TrainSeq}^*(\text{signal}(t)\cdot e^{-j2\pi\Delta ft}) \qquad\qquad (b)$$

in equations (a) and (b) above, $e^{j2\pi\Delta ft}$ is the NCO for determining the carrier frequency offset $\Delta f$, and * denotes correlation operation.

Both equations (a) and (b) may obtain the carrier frequency offset estimation. In equation (a), the training sequence is already factored in NCO, the MIMO module 124 adds different frequency offsets in the training sequence, and therefore, the NCO does not need to be determined in the digital signal. In equation (b), as the training sequence is not factored in the NCO, the NCO would be required to be calculated in the digital signal when the MIMO module 124 performs carrier frequency offset scanning. As such, the digital signal has to be first transformed back to time domain, and after NCO transformed back to frequency domain, which causes substantial extra complexity and power consumption. Therefore, in example embodiments, equation (a) is used instead of equation (b), because equation (a) enables the training sequence to be pre-processed with NCO, and is ready for use to directly correlate with the input digital signal.

As the carrier frequency offset also affects the maximum correlation value, the clock frequency offset scanning and carrier frequency offset scanning are simultaneously performed in a two-dimensional (2D) clock frequency offset and carrier frequency offset scanning, in order to obtain a relatively accurate estimation of clock frequency offset. As such, a 2D clock frequency offset and carrier frequency offset scanning simultaneously determines the estimation of sampling frequency offset $\Delta f_{clk\text{-}est}$ and carrier frequency offset $\Delta f_{est}$ in the digital signal. A reliable clock recovery in a T/1 receiver system typically is difficult. However, a 2D clock frequency offset and carrier frequency offset scanning ensures accuracy and stability for locking the sampling clock of the digital signal.

At step 206, the 2×2 MIMO module 124 performs a two-dimensional clock frequency offset and carrier frequency offset scanning based on the training sequence (TrainSeq) formed by the training symbols used at the transmitter 12. The input signals X and Y to the 2×2 MIMO module 124 are IQ compensated signals X and Y in frequency domain from the IQC unit 122. As discussed above, the signals X and Y input to the MIMO module 124 are a two-dimensional vector [X, Y], where:

$$X=\textit{fft}(\text{signalx})$$

$$Y=\textit{fft}(\text{signaly})$$

As discussed above, the sampling phase offset and carrier frequency offset still exist in the signal x and signal y. In order to determine the clock frequency offset estimation $\Delta f_{clk\text{-}est}$ and carrier frequency offset estimation $\Delta f_{est}$, a 2D clock frequency offset and carrier frequency offset scanning is performed at the MIMO module 124 by multiplying the input signal X and Y with the values in the MIMO taps update module 130, which is a 2×2 array in frequency domain:

$$\begin{bmatrix} W_{xx} & W_{xy} \\ W_{yx} & W_{yy} \end{bmatrix}$$

The values of MIMO taps update module 130 are:

$$W_{xx}=W_{xy}=\text{conj}(\textit{fft}(\text{TrainSeqx}\cdot e^{j\pi\Delta ft}))$$

$$W_{yy}=W_{yx}=\text{conj}(\textit{fft}(\text{TrainSeqy}\cdot e^{j\pi\Delta ft}))$$

The clock frequency offset estimation $\Delta f_{clk\text{-}est}$ and carrier frequency offset estimation $\Delta f_{est}$ correspond to the scan value at the maximum correlation peak value.

In a 2D clock frequency offset and carrier frequency offset scanning, the MIMO module 124 scans the carrier frequency offset $\Delta f$. The VCO 90, which is controlled by the MIMO module 124 of the Rx DSP 100, adjusts the clock frequency offset $\Delta f_{clk}$. The output of IFFT module 126 corresponds to the correlation result between the received digital signal X and Y with the known training sequences TrainSeqx, and TrainSeqy. The correlation maximum peak value is saved during each scanning that includes both clock frequency offset scanning and carrier frequency offset scanning. After the 2D clock frequency offset and carrier frequency offset scanning, the MIMO module 124 performs a 2D search to identify the maximum correlation peak value between the received digital signal X and Y with the known training sequences TrainSeqx, and TrainSeqy. The maximum correlation peak value determines the clock frequency offset estimation $\Delta f_{clk\text{-}est}$ and carrier frequency offset estimation $\Delta f_{est}$.

The VCO 90 is configured to adjust the sampling clock frequency of ADC 80 with a $-\Delta f_{clk\text{-}est}$ that corresponds to the estimated clock frequency offset $\Delta f_{clk\text{-}est}$. After this initial compensation, the residual clock frequency offset of signals x and y output from ADC 80 is reduced, for example, to less than 20 ppm. With the reduced residual clock frequency offset of signals X and Y, the MIMO module 124 may easily converge at blind equalizer step 208, such as a Blind LMS stage, and accurately and stably lock the sampling clock of the signals X and Y at a Timing Recovery (TR) stage. In some examples, the IQC unit 122 may roughly compensate the signals X and Y in frequency domain by the estimated carrier frequency offset estimation $\Delta f_{est}$ with an approximate frequency shift $-\Delta f_{est}'$. In some examples, the CR module 128 may compensate the entire or residual carrier frequency offset of signals X and Y.

After the signals X and Y are compensated with the initial estimated clock frequency offsets, at step 208, the MIMO module 124 equalizes digital signals X and Y in frequency domain. At step 208, MIMO module 124 uses the MIMO tap values set at step 204 as follows:

$$W_{xx}=W_{yy}=[1\ 1\ 1\ \ldots\ 1]\cdot H_{comp};\ W_{xy}=W_{yx}=[0\ 0\ 0\ \ldots\ 0]$$

and the MIMO module 124 equalizes the input signals X=fft(signalx) and Y=fft(signaly) by multiplying the X=fft(signalx) and Y=fft(signaly) with the MIMO taps values at the MIMO taps update module 130.

The output signals X and Y are updated according to the equations (1) and (2) below:

$$X=X\cdot W_{xx}+Y\cdot W_{yx} \quad (1)$$

$$Y=X\cdot W_{xy}+Y\cdot W_{yy} \quad (2)$$

At step 208, in some examples, the carrier recovery (CR) is bypassed and not involved in the signal processing process.

During the blind equalization process at step 208, in order to determine that the appropriate values of the MIMO taps update module 130, the MIMO module 124 is configured to continuously update the values of the MIMO taps update module 130. The criteria whether the MIMO module 124 is locked will be described in detail at step 210 below.

In the example of FIG. 2, the output of the IFFT module 126 is used to update the MIMO tap values of the taps update module 130, according to the following equations:

$$W_{xx}(m+1)=W_{xx}(m)+2\mu\cdot G\{E_x(m)X^*(m)\} \quad (3)$$

$$W_{yx}(m+1)=W_{yx}(m)+2\mu\cdot G\{E_x(m)Y^*(m)\} \quad (4)$$

$$W_{xy}(m+1)=W_{xy}(m)+2\mu\cdot G\{E_y(m)X^*(m)\} \quad (5)$$

$$W_{yy}(m+1)=W_{yy}(m)+2\mu\cdot G\{E_y(m)Y^*(m)\} \quad (6)$$

where $X^*(m)$ and $Y^*(m)$ are conjugate of the frequency domain digital signals containing X(m) and Y(m) in x and y polarization respectively, $E_x(m)$ and $E_y(m)$ are error signals associated with the frequency domain digital signals X(m) and Y(m) respectively, and $G\{\cdot\}$ is a gradient constraint, and $\mu$ is a step function representing a step size.

The MIMO taps update module 130 in FIG. 2 can update the MIMO tap values in accordance with equations (3)-(6).

The updated MIMO taps values are then used to update the signals X and Y using the Equations (1)-(2) above.

At step 210, the MIMO module 124 determines whether MIMO module 124 is locked or converged. If the root mean square (rms) value of the time domain error signal generated by the first adder 150 is smaller than a threshold set by the MIMO module 124, the MIMO module 124 is locked or converged.

If the MIMO module 124 is not locked, MIMO module 124 repeats step 208 to update the MIMO taps update module 130 in accordance with the equations (3)-(6), and to update the signals X and Y in accordance with the equations (1) and (2) until the rms value of the time domain error signal generated by the first adder 150 is smaller than the threshold.

After the MIMO module 124 is locked, at step 212, the Rx DSP 100 continues to perform timing recovery (TR) by calculating timing error in Baud $\tau_{Baud}$ using the timing error calculator 132. The timing error calculator 132 in FIG. 2 uses the output W(m) from the adder 154 to obtain the determinant as follows:

$$\det W = W_{xx}W_{yy}-W_{xy}W_{yx}.$$

The timing error calculator 132 derives the angle of the determinant, which contains timing error information represented by the equation below:

$$\varphi = \angle(detW) = 2\pi f\tau = 2\pi\frac{k}{N}f_s\tau = 2\pi\frac{k}{N}f_{Baud}\tau = 2\pi\frac{k}{N}\frac{\tau}{T_{Baud}} = 2\pi\frac{k}{N}\tau_{Baud},$$

$$k \in [0:N-1],$$

where
N is the number of the sample data points,
k is an integer, and $$f = \frac{k}{N}f_s,$$

k is an integer smaller than N,
fs is a sampling rate equal to the baud rate.
The mean of difference of φ is:

$$\overline{diff(\varphi)} = \frac{2\pi}{N}\tau_{Baud}$$

and $\tau_{Baud}$ is:

$$\tau_{Baud} = \frac{\overline{diff(\varphi)} \cdot N}{2\pi}$$

Using $\tau_{Baud}$, the loop filter 134 in FIG. 2 tunes the VCO 90 by the following filter:

$$\text{loopFilt} = (\tau_{Baud}(n) - \tau_{Baud}(n-1))^*\mu_p + \text{sign}(\tau_{Baud}(n))^*\mu_i \quad (7)$$

where $\mu_p$ and $\mu_i$ are step sizes, n is an integer.
In some examples, the loop filter 134 tunes the VCO 90 by the following filter:

$$\text{loopFilt} = \text{sign}(\tau_{Baud}(n) - \tau_{Baud}(n-1))^*k_p + \text{sign}(\tau_{Baud}(n))^*k_i \quad (8)$$

where $k_p$ and $k_i$ are step sizes.

Filter (8) converges faster than filter (7) by using the sign ( ) function.

VCO 90 in turn adjusts the sampling operation of the ADC 80 such that the timing error t Baud generated at the ADC 80 may be further reduced. At step 214, if the RMS value of timing errors $\tau_{Baud}$ of recent p blocks of data is less than or equal to a threshold, the timing recovery (TR) of the MIMO module 124 is locked. If $\tau_{Baud}$ is greater than the threshold at step 214, MIMO module 124 repeats steps 208-214 until timing error $\tau_{Baud}$ is less than or equal to the threshold and the timing recovery (TR) is locked.

In FIG. 3, after the TR is locked, to synchronize the frames of the digital signals X and Y at the receiver 14, the MIMO module 124 proceeds to a framer process at step 216 in order to determine the position of the training symbols in the digital signals X and Y.

Before the framing process, the MIMO module 124 saves the converged MIMO tap values as $H_{xx}$, $H_{yy}$, $H_{xy}$, $H_{yx}$.

At step 216, during the framing process, the MIMO module 124 correlates the timing recovered digital signal X and Y in frequency domain with the correlation results of the training sequence in frequency domain and the converged MIMO taps after blind equalizer at step 208.

In some examples, at step 216, the timing recovered digital signals X and Y input to the MIMO module 124 are denoted as:

$$X = \textit{fft}(\text{signalx})$$

$$Y = \textit{fft}(\text{signaly})$$

x and y are timing recovered signals at step 212.

The values of the MIMO taps update module 130 are the vector multiplication results of the frequency domain training sequences in X and Y polarizations and respective MIMO taps update module 130 before framing process:

$$W_{xx} = \textit{fft}(\text{TrainSeqx}) \cdot H_{xx}$$

$$W_{yy} = \textit{fft}(\text{TrainSeqy}) \cdot H_{yy}$$

$$W_{xy} = \textit{fft}(\text{TrainSeqx}) \cdot H_{xy}$$

$$W_{yx} = \textit{fft}(\text{TrainSeqy}) \cdot H_{yx}$$

where TrainSeqx, TrainSeqy are formed by the training symbols in the X and Y-polarized signals, and $H_{xx}$, $H_{yy}$, $H_{xy}$, $H_{yx}$ are vectors containing converged MIMO taps values before framing process.

By correlating (multiplying in frequency domain) the input digital signals with MIMO taps update module 130 at the MIMO module 124, the MIMO module 124 derives the position of the training symbols in a frame in accordance with the position of the maximum correlation value.

At step 216, the MIMO module 124 suspends the MMO taps updating and timing recovery (TR) during the framer process. As MIMO module 124 has already been locked at step 216, only limited number of blocks of data is sufficient in the framing process to identify the training symbol position in the frame.

In short-reach applications, for example the distance between the transmitter 12 and the receiver 14 is within 40 Kilometers, as the adaptive channel impairments varies slowly and timing variation is slow, temporary suspension of MIMO and TR updating generally does not affect performance, such as Bit Error Rate (BER). In the worse circumstance, the framer may be misaligned by one or more symbols. Due to the misalignment, the estimated timing error may shift by one or more symbols. Although the timing error $\tau_{Baud}$ may gradually reduce to 0, the BER of the digital signals may increase.

To solve this problem, the MIMO module 124 may adjust a framer index by the number of symbols corresponding to the number of symbols of a timing error shifting. For example, once the timing error is shifted by one or more symbols after framer at step 216, the MIMO module 124 may accordingly adjust framer index by one or more symbols to reduce the BER. As such, the BER may be maintained at an acceptable range.

Before the framer synchronization, as discussed above, as the location of the training symbol at the step 208 is unknown, the MIMO taps update module 130 is updated by the desired response generated by the slicer 129. After the famer synchronization at step 216, the MIMO module 124 is able to identify the position of the training symbols in a frame, and the location of payload data in a frame. As such, the MIMO module 124 may further update the MIMO taps update module 130 with the training symbols to further compensate the impairment at step 218.

At step 218, MIMO module 124 turns on the CR module 128 in FIG. 2 and uses training symbols to further update the MIMO taps update module 130. The input signal to the MIMO module 124 are denoted as follows:

$X = \text{fft}(\text{signalx})$ $Y = \text{fft}(\text{signaly})$ where x and y are TR locked digital signals in time domain. The initial value of the MIMO taps update module 130 at step 218 are as follows:

$W_{xx} = H_{xx}$ $W_{yy'} = H_{yy'}$ $W_{xy'} = H_{xy'}$ $W_{yx} = H_{yx}$ where $H_{xx}$, $H_{yy'}$, $H_{xy'}$, $H_{yx}$ are vectors containing converged MIMO taps before framing process.

In the example of FIG. 2, after the save last block module 127 removes first N samples from time domain digital signals x and y, the time domain digital signals x and y are input to the CR module 128. The CR module 128 is configured to compensate the carrier frequency offset and phase shift in signals x and y. The carrier frequency offset and phase shift compensated signals x and y are then provide to the slicer 129.

The slicer 129, based on the identified position of the training symbols in the digital signals x and y at step 216, compares the training symbols in the digital signals x and y from the save last block module 127 with the standard training symbols, and compares the payload portion with a desired response. The slicer 129 generates a time domain error signal using the comparison results of the training symbols and the payload. By using the training symbols as the reference value, the slicer 129 can more accurately determine the error signal than using blind desired response at step 208.

The time domain error signal is provided to insert zero block module 152 for updating the MIMO taps update module 130 as described at step 208 above. The MIMO taps update module 130 may be updated in accordance with equations (3)-(6) described above, and MIMO module 124 updates the signal X and Y in frequency domain in accordance with equations (1)-(2).

The digital signals output from the CR module 128 may be used for further processing by the Rx DSP 100, such as Forward Error Correction (FEC).

At step 218, the MIMO module 124 updates the MIMO taps until the rms value of a time domain error of the digital signal X- and Y-polarizations is smaller than or equal to a second predetermined threshold. In some examples, the second predetermined threshold is smaller than the first predetermined threshold used for equalizing the digital signals at step 208. As such, at step 218, the errors in signals X and Y is in a smaller scale than the blind equalizing processing step 208 without using the training symbols.

For each subsequent signal received by the Rx DSP 100, the MIMO module 124 may update MIMO taps update module 130 using only step 218, without performing steps 202-216.

As described above, the frequency domain signals X and Y are multiplied at the MIMO module 124 with the vectors of MIMO taps update module 130 for various impairment compensations. Frequency domain vector multiplication corresponds to correlation operation in time domain. As the MIMO module 124 processes the X and Y signals by vector in frequency domain, the processing speed of MIMO module 124 in frequency domain is therefore faster than processing one signal at a time in the time domain. As such, processing the X and Y signals in frequency domain by the MIMO module 124 also saves power.

In some examples, the MIMO module 124 may be a single-stage FDMIMO for the Rx DSP 100 to further reduce power consumption. Single-stage FDMIMO is disclosed in a related patent application No. 63/010,827, entitled "System and Method for signal-stage Frequency-Domain Equalization", filed on Apr. 16, 2020, the content of which is incorporated herein in its entirety by reference.

Figure 4:
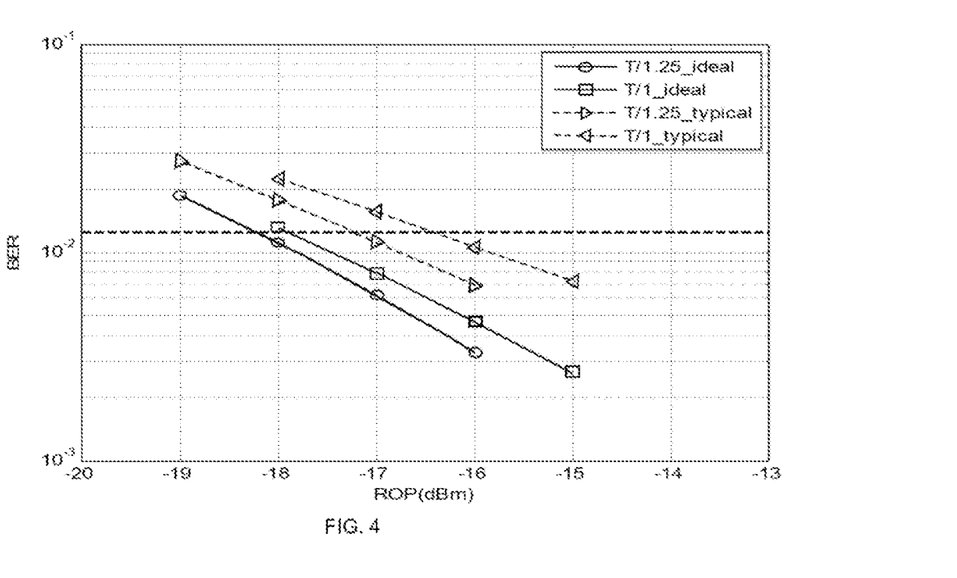
FIG. 4 illustrates simulated performance of the Rx DSP in FIG. 1, in accordance with embodiments of present disclosure, in terms of bit error rate (BER) and received optical power (ROP)

The Rx DSP 100 for the receiver 14 provides a low-power and efficient symbol-rate Rx DSP scheme. FIG. 4 shows BER performance comparison of T/1.25 (sampling rate=1.25*symbol rate) DSP and T/1 Rx DSP 100 at a receiver 14 in terms of received optical power (ROP) at ideal and typical test cases, respectively. Compared with T/1.25, the power consumption of Rx DSP 100 in T/1 in the present disclosure can be saved by around 20% for ADC 80. The total saved power by the T/1 Rx DSP 100 may reach 30%.

It should be noted that for all the tests measured, S21 is used for both the transmitter 12 and receiver 14, and that the ideal case is B2B case with no impairments except for S21, while 'typical' case corresponds to a 10 km transmission scenario with various impairments.

In ideal case, Rx DSP 100 performs 0.2 dB worse than T/1.25 at a Forward Error Correction (FEC) threshold of 1.25e-2. This penalty comes from imperfection of S21 shape and aliasing. While in typical case, Rx DSP 100 performs 0.7 dB worse than T/1.25. The increased penalty in the typical case comes from the limited ability of impairment compensation in T/1, such as skew compensation. However, the penalty is acceptable for the low-power design.

Figure 5:
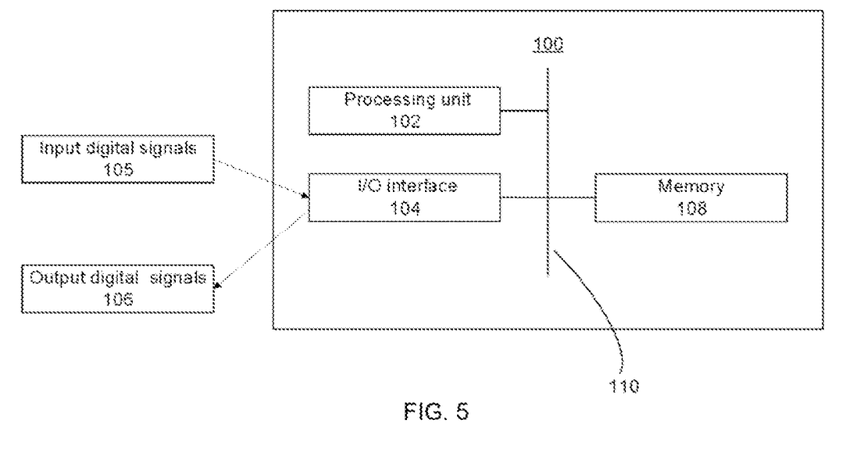
FIG. 5 is a block diagram of an example hardware structure of the Rx DSP in FIG. 1.

FIG. 5 is a block diagram, illustrating an example hardware structure of the Rx DSP 100. In FIG. 5, the Rx DSP 100 comprises a processing unit 102, an Input/Output (I/O) interface 104, and a memory 108.

The processing unit 102 may be a processor, a microprocessor, an application-specific integrated circuit (ASIC), a field-programmable gate array (FPGA), a dedicated logic circuitry, or combinations thereof.

The input/output (I/O) interfaces 104 allows to receive input digital signals 105 from the ADC 80 and to transmit processed digital signals 106 for further processing in system 10.

The memory 108 may include a volatile or non-volatile memory e.g., a flash memory, a random-access memory (RAM), and/or a read-only memory (ROM). The non-transitory memory 108 may store instructions for execution by the processing unit 102, such as to carry out methods or processes described in the example of the present disclosure. The memory 108 may include other software instructions, such as for implementing an operating system and other applications/functions.

In the Rx DSP 100, the Fast Fourier Transformation (FFT) module 120, IQC unit 122, 2×2 multiple input multiple output (MIMO) 124, IFFT module 126, Carrier Recovery (CR) module 128 and the timing error calculator 132 may be implemented by the processing unit 102, and MIMO taps updating module 130 may be implemented in the processing unit 102 and memory 108.

In some other examples, memory 108 may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

The bus 110 providing communication channels among components of the Rx DSP 100, including the processing unit 102, I/O interface 104, and/or memory 108. The bus 108 may be any suitable bus architecture including, for example, a memory bus, or a peripheral bus.

Although the present disclosure describes methods and processes with steps in a certain order, one or more steps of the methods and processes may be omitted or altered as appropriate. One or more steps may take place in an order other than that in which they are described, as appropriate.

An example embodiment is a method for processing signals in a receiver, comprising: receiving a digital signal at a symbol rate in frequency domain; and compensating an impairment of the digital signal in frequency domain.

In another example embodiment, in the preceding methods, compensating the impairment comprises compensating the digital signal in an in-phase and quadrature skew and a quadrature error in frequency domain.

In another example embodiment, in the preceding methods, the in-phase and quadrature skew of the digital signal in X polarization is compensated by $$XQ = XQ \cdot e^{j2\pi\Delta\tau}$$

where XQ is a phase Q of signal X in frequency domain, and $\Delta\tau$ is a skew of signal X.

In another example embodiment, in the preceding methods, the quadrature error of the digital signal in X polarization is compensated by $$XQ = XQ + XI \cdot \sin\left(\frac{\Delta Err}{\pi}\right)$$

where XI is phase I of the digital signal in X polarization in frequency domain, and $\Delta Err$ is quadrature errors of the digital signal in X polarization.

In another example embodiment, in the preceding methods, compensating the impairment comprises: determining, at a 2×2 multiple input multiple output (MIMO), a clock frequency offset estimation $\Delta f_{clk-est}$ and a carrier frequency offset estimation $\Delta f_{est}$ in the digital signal; and adjusting a sampling clock frequency of an analog to digital convertor (ADC) of the receiver by a $-\Delta f_{clk-est}$.

In another example embodiment, in the preceding methods further comprise: compensating, at an In-phase Quadrature Compensation (IQC), the digital signal in frequency domain by a $-\Delta f_{est}$.

In another example embodiment, in the preceding methods, the $\Delta f_{clk-est}$ and the $\Delta f_{est}$ is determined by correlating in frequency domain, at the 2×2 MIMO, digital signals x and y in time domain in X- and Y-polarizations with a MIMO taps:

$$\begin{bmatrix} W_{xx} & W_{xy} \\ W_{yx} & W_{yy} \end{bmatrix}$$

$X=fft(\text{signalx})$ $Y=fft(\text{signaly})$ where:

$W_{xx}=W_{xy}=\text{conj}(fft(\text{TrainSeqx} \cdot e^{j2\pi\Delta ft}))$ $W_{yy}=W_{yx}=\text{conj}(fft(\text{TrainSeqy} \cdot e^{j2\pi\Delta ft}))$ and where TrainSeqx and TrainSeqy are training sequences of signals x and y in X- and Y-polarizations, respectively, wherein the $\Delta f_{clk-est}$ and the $\Delta f_{est}$ correspond to scan values at a maximum correlation peak value.

In another example embodiment, in the preceding methods, compensating the impairment of the digital signal comprises: equalizing the digital signals in X- and Y-polarizations in frequency domain until a time domain error signal of the digital signal X- and Y-polarizations is less than or equal to a predetermined threshold.

In another example embodiment, in the preceding methods, equalizing the digital signals in X- and Y-polarizations in frequency domain comprises: correlating the digital signals in X- and Y-polarizations in frequency domain with the MIMO taps, wherein values of the MIMO taps are:

$W_{xx}=W_{yy}=[1\ 1\ 1\ \ldots\ 1] \cdot H_{comp}$; $W_{xy}=W_{yx}=[0\ 0\ 0\ \ldots\ 0]$ and updating the digital signals in X- and Y-polarizations by $X=X \cdot W_{xx}+Y \cdot W_{yx},\ Y=X \cdot W_{xy}+Y \cdot W_{yy}$ where $H_{comp}$ is a compensation response to compensate non-time-varying fixed impairments.

In another example embodiment, in the preceding methods, equalizing the digital signals in X- and Y-polarizations in frequency domain comprises: updating the MIMO taps by $W_{xx}(m+1)=W_{xx}(m)+2\mu \cdot G\{E_x(m)X^*(m)\}$ $W_{yx}(m+1)=W_{yx}(m)+2\mu \cdot G\{E_x(m)Y^*(m)\}$ $W_{xy}(m+1)=W_{xy}(m)+2\mu \cdot G\{E_y(m)X^*(m)\}$ $W_{yy}(m+1)=W_{yy}(m)+2\mu \cdot G\{E_y(m)Y^*(m)\}$ where $X^*(m)$ and $Y^*(m)$ are conjugate of the frequency domain digital signals containing $X(m)$ and $Y(m)$ in x and y polarization respectively, $E_x(m)$ and $E_y(m)$ are error signals associated with the frequency domain digital signals $X(m)$ and $Y(m)$ respectively, and $G\{\cdot\}$ is a gradient constraint, and $\mu$ is a step function.

In another example embodiment, the preceding methods further comprise:

determining a timing error $\tau_{Baud}$ of the digital signal; and
tuning, by a loop filter, a voltage-controlled oscillator (VCO) until the timing error is less than or equal to a threshold.

In another example embodiment, in the preceding methods, the timing error $\tau_{Baud}$ is determined based on $$\tau_{Baud} = \frac{\overline{diff(\varphi)} \cdot N}{2\pi}$$

$$\varphi = \text{unwrap}(\text{angle}(\textit{fftshift}(detW))) = 2\pi f\tau = 2\pi \frac{(0:N-1)}{N}\tau_{Baud}$$

$detW=W_{xx}*W_{yy}-W_{xy}*W_{yx}$ where $W_{xx}$, $W_{yy}$, $W_{xy}$, $W_{yx}$ are converged MIMO tap values, N is sample data point number, and $f=k/Nf_s$ is a frequency of the digital signals, K is an integer smaller than N, fs is a sampling rate equal to a baud rate.

In another example embodiment, in the preceding methods, the loop filter tunes the VCO using a following equation:

$$\text{loopFilt}=(\tau_{Baud}(n)-\tau_{Baud}(n-1))*\mu_p+\text{sign}(\tau_{Baud}(n))*\mu_i$$

where $\mu_p$ and $\mu_i$ are step sizes.

In another example embodiment, in the preceding methods, the loop filter tunes the VCO using the following equation:

$$\text{loopFilt}=\text{sign}(\tau_{Baud}(n)-\tau_{Baud}(n-1))*k_p+\text{sign}(\tau_{Baud}(n))*k_i$$

where $k_p$ and $k_i$ are step sizes.

In another example embodiment, the preceding methods further comprise:
suspending MIMO and timing recovery updating; and
determining a position of training symbols in the digital signal.

In another example embodiment, in the preceding methods, determining the position of training symbols in the digital signal comprises: correlating timing error recovered digital signal in X- and Y-polarizations in frequency domain with the MIMO taps having values of:

$$W_{xx}=\textit{fft}(\text{TrainSeqx})\cdot H_{xx}$$

$$W_{yy}=\textit{fft}(\text{TrainSeqy})\cdot H_{yy}$$

$$W_{xy}=\textit{fft}(\text{TrainSeqx})\cdot H_{xy}$$

$$W_{yx}=\textit{fft}(\text{TrainSeqy})\cdot H_{yx}$$

where TrainSeqx and TrainSeqy are formed by the training symbols in the X and Y-polarized signals in time domain, and $H_{xx}$, $H_{yy}$, $H_{xy}$, $H_{yx}$ are converged MIMO taps after equalizing the digital signal in X- and Y-polarizations in frequency domain.

In another example embodiment, the preceding methods further comprise adjusting, by the 2×2 MIMIO, a framer index corresponding to a timing error shifting amount.

In another example embodiment, the preceding methods further comprise: determining a time domain error of the digital signal X- and Y-polarizations in time domain by using training symbols; and updating MIMO taps until the time domain error of the digital signal X- and Y-polarizations is smaller than or equal to a second predetermined threshold.

In another example embodiment, in the preceding methods, updating the MIMO taps comprises updating the MIMO taps by:

$$W_{xx}(m+1)=W_{xx}(m)+2\mu\cdot G\{E_x(m)X^*(m)\}$$

$$W_{yx}(m+1)=W_{yx}(m)+2\mu\cdot G\{E_x(m)Y^*(m)\}$$

$$W_{xy}(m+1)=W_{xy}(m)+2\mu\cdot G\{E_y(m)X^*(m)\}$$

$$W_{yy}(m+1)=W_{yy}(m)+2\mu\cdot G\{E_y(m)Y^*(m)\}.$$

where $X^*(m)$ and $Y^*(m)$ are conjugate of the frequency domain digital signals containing X(m) and Y(m) in x and y polarization respectively,
$E_x(m)$ and $E_y(m)$ are error signals associated with the frequency domain digital signals X(m) and Y(m) respectively,
$G\{\}$ is a gradient constraint, and $\mu$ is a step function, wherein initial value of the MIMO taps are as follows:

$$W_{xx}=H_{xx}$$

$$W_{yy}=H_{yy}$$

$$W_{xy}=H_{xy}$$

$$W_{yx}=H_{yx}.$$

In another example embodiment, in the preceding methods, the second predetermined threshold is smaller than the predetermined threshold.

In another example embodiment, the preceding methods further comprise compensating for frequency offset and phase shift of the digital signals using a carrier recovery.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processor device (e.g., a personal computer, a server, or a network device) to execute examples of the methods disclosed herein.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

Certain adaptations and modifications of the described embodiments can be made. Therefore, the above discussed embodiments are considered to be illustrative and not restrictive.

What is claimed is:

1. A digital signal processor (DSP) for a receiver, comprising:
a processor configured to:
receive a digital signal at a symbol rate in a frequency domain; and
compensate an impairment of the digital signal in the frequency domain by determining, at a 2×2 multiple input multiple output (MIMO), a clock frequency offset estimation $\Delta f_{clk\text{-}est}$ and a carrier frequency offset estimation $\Delta f_{est}$ in the digital signal, and adjusting a sampling clock frequency of an analog to digital convertor (ADC) of the receiver by a $-\Delta f_{clk\text{-}est}$.

2. The DSP of claim 1, further comprising:
compensating, at an In-phase Quadrature Compensation (IQC), the digital signal in frequency domain by a $-\Delta f_{est}$.

3. The DSP of claim 1, wherein the $\Delta f_{clk-est}$ and the $\Delta f_{est}$ are determined by correlating in frequency domain, at the 2×2 MIMO, digital signals x and y in time domain in X- and Y-polarizations with a MIMO taps:

$$\begin{bmatrix} W_{xx} & W_{xy} \\ W_{yx} & W_{yy} \end{bmatrix}$$

$X=fft(\text{signalx})$ $Y=fft(\text{signaly})$ where:

$W_{xx}=W_{xy}=\text{conj}(fft(\text{TrainSeqx}\cdot e^{j\pi\Delta ft}))$ $W_{yy}=W_{yx}=\text{conj}(fft(\text{TrainSeqy}\cdot e^{j\pi\Delta ft}))$ and where TrainSeqx and TrainSeqy are training sequences or signals x and y in X- and Y-polarizations, respectively, wherein the $\Delta f_{clk-est}$ and the $\Delta f_{est}$ correspond to scan values at a maximum correlation peak value.

4. The DSP of claim 3, wherein compensating the impairment of the digital signal comprises:
equalizing the digital signals in X- and Y-polarizations in frequency domain until a root mean square value of a time domain error signal of the digital signal X- and Y-polarizations is smaller than or equal to a predetermined threshold.

5. The DSP of claim 4, wherein equalizing the digital signals in X- and Y-polarizations in frequency domain comprises:
correlating the digital signals in X- and Y-polarizations in frequency domain with the MIMO taps, at the MIMO, wherein values of the MIMO taps are:

$W_{xx}=W_{yy}=[1\ 1\ 1\ .\ .\ .\ 1]\cdot H_{comp};\ W_{xy}=W_{yx}=[0\ 0\ 0\ .\ .\ .\ 0];$ and updating the digital signals in X- and Y-polarizations by $X=X\cdot W_{xx}+Y\cdot W_{yx},\ Y=X\cdot W_{xy}+Y\cdot W_{yy}$ where $H_{comp}$ is a compensation response to compensate non-time-varying fixed impairments.

6. The DSP of claim 5, further comprising:
updating the MIMO taps by $W_{xx}(m+1)=W_{xx}(m)+2\mu\cdot G\{E_x(m)X^*(m)\}$ $W_{yx}(m+1)=W_{yx}(m)+2\mu\cdot G\{E_x(m)Y^*(m)\}$ $W_{xy}(m+1)=W_{xy}(m)+2\mu\cdot G\{E_y(m)X^*(m)\}$ $W_{yy}(m+1)=W_{yy}(m)+2\mu\cdot G\{E_y(m)Y^*(m)\}.$ where $X^*(m)$ and $Y^*(m)$ are conjugate of the frequency domain digital signals containing $X(m)$ and $Y(m)$ in x and y polarization respectively,
$E_x(m)$ and $E_y(m)$ are error signals associated with the frequency domain digital signals $X(m)$ and $Y(m)$ respectively,
$G\{\cdot\}$ is a gradient constraint, and $\mu$ is a step function.

7. The DSP of claim 4, wherein compensating impairment of the digital signal comprises:
determining a timing error $\tau_{Baud}$ of the digital signal; and
tuning, by a loop filter, a voltage-controlled oscillator (VCO) until the timing error is smaller than a predetermined threshold.

8. The DSP of claim 7, the timing error $\tau_{Baud}$ is determined based on $$\tau_{Baud} = \frac{\overline{diff(\varphi)}\cdot N}{2\pi}$$

$\varphi = \text{unwrap}(\text{angle}(fftshift(detW))) = 2\pi f\tau = 2\pi\frac{(0:N-1)}{N}\tau_{Baud}$ $detW=W_{xx}*W_{yy}-W_{xy}*W_{yx}$ where $W_{xx}$, $W_{yy}$, $W_{xy}$, $W_{yx}$ are converged MIMO tap values, N is sample data point number, and $f=k/Nf_s$ is a frequency of the digital signals, K is an integer smaller than N, fs is a sampling rate equal to a baud rate.

9. The DSP of claim 8, wherein the loop filter tunes the VCO based on:

$\text{loopFilt}=\text{sign}(\tau_{Baud}(n)-\tau_{Baud}(n-1))*k_p+\text{sign}(\tau_{Baud}(n))*k_i$ where $k_p$ and $k_i$ are step sizes.

10. The DSP of claim 7, wherein the loop filter tunes the VCO based on:

$\text{loopFilt}=(\tau_{Baud}(n)-T_{Baud}(n-1))*\mu_p+\text{sign}(\tau_{Baud}(n))*\mu_i$ Where $\mu_p$ and $\mu_i$ are step sizes.

11. The DSP of claim 7, further comprising:
suspending MIMO and timing recovery updating; and
determining position of training symbols in the digital signal.

12. The DSP of claim 11, wherein determining position of training symbols in the digital signal comprises:
correlating timing error recovered digital signal in X- and Y-polarizations in frequency domain with the MIMO taps having values of:

$W_{xx}=fft(\text{TrainSeqx})\cdot H_{xx}$ $W_{yy}=fft(\text{TrainSeqy})\cdot H_{yy}$ $W_{xy}=fft(\text{TrainSeqx})\cdot H_{xy}$ $W_{yx}=fft(\text{TrainSeqy})\cdot H_{yx}$ where TrainSeqx and TrainSeqy are formed by the training symbols in the X and Y-polarized signals in time domain, and $H_{xx}$, $H_{yy}$, $H_{xy}$, $H_{yx}$ are converged MIMO taps after equalizing the digital signal in X- and Y-polarizations in frequency domain.

13. The DSP of claim 11, further comprising adjusting, by the 2×2 MIMIO, a framer index corresponding to a timing error shifting amount.

14. The DSP of claim 11, wherein compensating impairment of the digital signal further comprises:
determining a time domain error of the digital signal X- and Y-polarizations in time domain by using training symbols; and
updating MIMO taps until the time domain error of the digital signal X- and Y-polarizations is smaller than or equal to a second predetermined threshold.

15. The DSP of claim 14, wherein updating MIMO taps comprises updating the MIMO taps by:

$W_{xx}(m+1)=W_{xx}(m)+2\mu\cdot G\{E_x(m)X^*(m)\}$ $W_{yx}(m+1)=W_{yx}(m)+2\mu\cdot G\{E_x(m)Y^*(m)\}$ $W_{xy}(m+1)=W_{xy}(m)+2\mu\cdot G\{E_y(m)X^*(m)\}$ $W_{yy}(m+1)=W_{yy}(m)+2\mu\cdot G\{E_y(m)Y^*(m)\}.$ where $X^*(m)$ and $Y^*(m)$ are conjugate of the frequency domain digital signals containing $X(m)$ and $Y(m)$ in x and y polarization respectively, $E_x(m)$ and $E_y(m)$ are error signals associated with the frequency domain digital signals $X(m)$ and $Y(m)$ respectively, $G\{\cdot\}$ is a gradient constraint, and $\mu$ is a step function, wherein initial value of the MIMO taps are as follows:

$W_{xx}=H_{xx}$ $W_{yy}=H_{yy}$ $W_{xy}=H_{xy}$ $W_{yx}=H_{yx}$.

16. The DSP of claim 14, wherein the second predetermined threshold is smaller than the predetermined threshold.

17. The DSP of claim 14 further comprising compensating for frequency offset and phase shift of the digital signals using a carrier recovery.

18. A method for processing a digital signal at a digital signal processor (DSP) of a receiver, comprising:
receiving the digital signal at a symbol rate in a frequency domain; and
compensating an impairment of the digital signal in the frequency domain by:
determining, at a 2×2 multiple input multiple output (MIMO), a clock frequency offset estimation $\Delta f_{clk-est}$ and a carrier frequency offset estimation $\Delta f_{est}$ in the digital signal, and
adjusting a sampling clock frequency of an analog to digital convertor (ADC) of the receiver by a $-\Delta f_{clk-est}$.

19. The method of claim 18, further comprising:
compensating, at an In-phase Quadrature Compensation (IQC), the digital signal in frequency domain by a $-\Delta f_{est}$.

20. The method of claim 18, wherein the $\Delta f_{clk-est}$ and the $\Delta f_{est}$ are determined by correlating in frequency domain, at the 2×2 MIMO, digital signals x and y in time domain in X- and Y-polarizations with a MIMO taps:

$$\begin{bmatrix} W_{xx} & W_{xy} \\ W_{yx} & W_{yy} \end{bmatrix}$$

$X=fft(\text{signalx})$ $Y=fft(\text{signaly})$ where:

$W_{xx}=W_{xy}=\text{conj}(fft(\text{TrainSeqx}\cdot e^{j\pi\Delta ft}))$ $W_{yy}=W_{yx}=\text{conj}(fft(\text{TrainSeqy}\cdot e^{j\pi\Delta ft}))$ and where TrainSeqx and TrainSeqy are training sequences or signals x and y in X- and Y-polarizations, respectively, wherein the $\Delta f_{clk-est}$ and the $\Delta f_{est}$ correspond to scan values at a maximum correlation peak value.

* * * * *

UNITED STATES PATENT AND TRADEMARK OFFICE
CERTIFICATE OF CORRECTION

PATENT NO. : 12,388,457 B2
APPLICATION NO. : 18/140145
DATED : August 12, 2025
INVENTOR(S) : Jianhong Ke, Zilong He and Chuandong Li It is certified that error appears in the above-identified patent and that said Letters Patent is hereby corrected as shown below:

In the Claims

Claim 3, Column 19, Line 16-19:

$$W_{xx} = W_{xy} = conj(fft(TrainSeqx \cdot e^{j\pi\Delta ft}))$$

"$W_{yy} = W_{yx} = conj\left(fft(TrainSeqy \cdot e^{j\pi\Delta ft})\right).$"

Should read:

$$W_{xx} = W_{xy} = conj(fft(TrainSeqx \cdot e^{j2\pi\Delta ft}))$$

-- $W_{yy} = W_{yx} = conj\left(fft(TrainSeqy \cdot e^{j2\pi\Delta ft})\right).$ --

Claim 8, Column 20, Line 14:
"of the digital signals, K is an integer smaller than N, fs is a"
Should read:
-- of the digital signals, K is an integer smaller than N, $f_s$ is a --

Signed and Sealed this
Thirtieth Day of September, 2025

John A. Squires
*Director of the United States Patent and Trademark Office*

CERTIFICATE OF CORRECTION (continued)
U.S. Pat. No. 12,388,457 B2

<u>Claim 20, Column 22, Lines 23-25:</u>

" $$W_{xx} = W_{xy} = conj(fft(TrainSeqx \cdot e^{j\pi\Delta ft}))$$

$$W_{yy} = W_{yx} = conj\left(fft(TrainSeqy \cdot e^{j\pi\Delta ft})\right).$$ "

Should read:

-- $$W_{xx} = W_{xy} = conj(fft(TrainSeqx \cdot e^{j2\pi\Delta ft}))$$

$$W_{yy} = W_{yx} = conj\left(fft(TrainSeqy \cdot e^{j2\pi\Delta ft})\right).$$ --